United States Patent [19]

Alexander et al.

[11] Patent Number: 5,059,560
[45] Date of Patent: Oct. 22, 1991

[54] BI-CA-SR-CU-ZN-O SUPERCONDUCTING GLASS-CERAMICS

[75] Inventors: M. Grayson Alexander, Newfield; George H. Beall, Big Flats; Candace J. Quinn, Corning; C. John Yu, Painted Post, all of N.Y.

[73] Assignee: Corning Incorporated, Corning, N.Y.

[21] Appl. No.: 496,946

[22] Filed: Mar. 21, 1990

Related U.S. Application Data

[63] Continuation-in-part of Ser. No. 287,737, Dec. 21, 1988, abandoned.

[51] Int. Cl.$^5$ ............................................ C03C 10/02
[52] U.S. Cl. ...................................... 501/10; 505/782; 505/809
[58] Field of Search .................... 501/10; 505/782, 809

[56] References Cited

PUBLICATIONS

Kometsu et al.; "High Tc Superconducting Glass Ceramics Based on the Bi—Ca—Sr—Cu—O System", Japanese Journal of Applied Physics, vol. 27, No. 4 Apr. 1988, pp. L550–552.
Inoue et al.; "Production of Bi—Sr—Cr—Cu—O glasses by Liquid Quenching and their Glass Transition and Structural Relaxation", Japanese Journal of Applied Physics, vol. 27, No. 6, Jun. 1988, L 941–942.
Matsushita, et al.; "Superconductor Glass-Ceramic by Melting-Quenching Method", Japanese Nikken Kogyo News, Mar. 16, 1988.
Abe, et al.; "Superconducting Glass—Ceramic Rods in BiCaSrCu$_2$O$_x$ prepared by crystallization under a Temperature Gradient"; applied Physics Letters 53(14) Oct. 3, 1988, pp. 1341–1342.
Akamatsu, et al. "Instantenous Preparation of Superconducting Thick Films Through Melt in the Bi—Cr—Sr—Cu—O System"; Japanese Journal of Applied Physics vol. 27, No. 9, Sep. 1988, pp. L1696–1698.

Primary Examiner—Mark L. Bell
Attorney, Agent, or Firm—Kees van der Sterre

[57] ABSTRACT

A glass-ceramic superconductor is disclosed, having a nominal stoichiometric composition consisting essentially of the oxides of Bi, Ca, Sr, Cu and Zn in the stoichiometric formula range: $Bi_2Ca_xSr_zZn_nCu_wO_y$, wherein x ranges about 1–2, z ranges about 1–2, n ranges about 0.001–2, w ranges about 1–2, and y ranges about 6–11. These compositions exhibit greatly improved glass stability, yet can yield highly crystalline superconductors which may include large platelet crystals and which can exhibit very low room temperature resistivity.

5 Claims, 3 Drawing Sheets

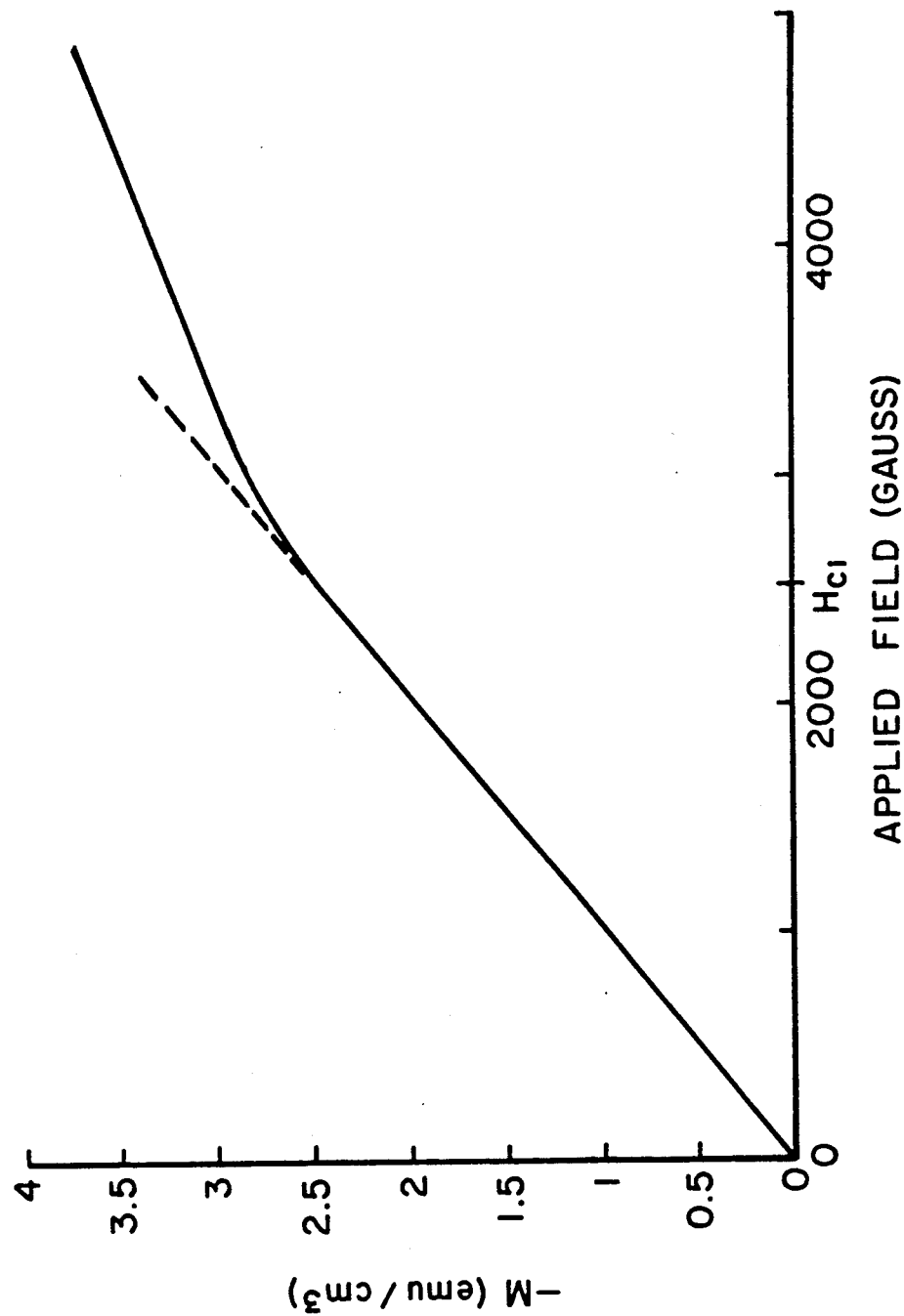

BI-CA-SR-CU-ZN-O SUPERCONDUCTING GLASS-CERAMICS

This is a Continuation-In-Part of application Ser. No. 07/287,737, filed Dec. 21, 1988, now abandoned.

BACKGROUND OF THE INVENTION

The present invention is directed towards a superconducting glass-ceramic material and method for making the same. The composition of this glass-ceramic material is derived from the Bi-Ca-Sr-Cu-O family of superconductors. In particular, it has been discovered that when the Ca to Sr combination is maintained in certain proportions and, preferably, controlled additions of ZnO are provided, that relatively stable glasses crystallizable to glass-ceramics with good superconducting properties can be produced.

Further, with appropriate heat treatment, a particularly desirable crystal morphology, also observed in Bi-Ca-Sr-Cu-O superconductors, can be developed in these stable glasses. This is a morphology comprising platelets or crystallites with an angularly juxtapositionally disposed orientation that exhibit very good superconductivity properties in combination with low room temperature resistivity.

It is well known to those skilled in the superconductor art that this fast paced technology is in need of a composition and process whereby useful products can be manufactured. The ceramics of the first discovery, by Bednorz and Muller created excitement and happily spurred research, due to a significant raising of the critical temperature of superconductivity in their ceramic discovery.

The yttrium-barium-copper oxide (1:2:3) superconductor of the Chu et al. discovery, while exhibiting superconductivity at higher temperatures, does not exhibit mechanical strength, useful crystal orientation, nor sufficient crystal positional proximity for useful products. The 1:2:3 superconductivity discovery cannot be trivialized, however, since this discovery has inspired others to invent additional ceramic superconductive compositions.

Recently, Maeda et al. in the Japanese Journal of Applied Physics 27, L209, (1988), disclosed the discovery of a new family of ceramic superconductors. This family is known as the Bi-Ca-Sr-Cu-O ceramic superconductors. The particular member of that family that excited interest is the $BiCaSrCu_2O_y$, known as 1:1:1:2. The 1:1:1:2 ceramic suffered similarly from the same poor properties exhibited by the initial 1:2:3 find.

Since the Maeda et al. revelations, others have come forward with discoveries of cousins to the 1:1:1:2 material. Komatsu et al. in the Japanese Journal of Applied Physics, 27, 4, April 1988 discloses a glass-ceramic material with a composition from the Maeda family of superconductors. The glass-ceramics introduced by Komatsu are 3:2:2:4 and 3:3:2:4 type Bi-Ca-Sr-Cu-O materials. Komatsu first makes a glass with the material, rapidly quenches the glass, then anneals the glass forming a thin layer of ceramic material on the surface.

Similarly, Akamatsu et al. describe, in the Japanese Journal of Applied Physics, 27 (9) pages L1696—L1698 (September 1988), thick film superconducting compositions in the Bi-Ca-Sr-Cu-O composition system produced by the crystallization of mixed oxide melts on single-crystal MgO substrates. Nevertheless, prior art compositions of these known types tend to exhibit very poor glass stability and are difficult to form as glasses without uncontrolled crystallization.

SUMMARY OF THE INVENTION

The present invention includes compositions derived from the Bi-Ca-Sr-Cu-O family of superconductors. Additionally, the material is a glass-ceramic. Following the nomenclature of the community, the compositions of the inventive glass-ceramic are such that Bi:Ca:Sr:Cu oxide phases of 2:1:2:2, 2:2:2:3, 4:3:3:4, and 2:1:1:1 composition and combinations therebetween can be developed on suitable heat treatment. The material exhibits a variety of useful properties including good glass-forming characteristics, high mechanical strength, platelets or crystallites with highly defined geometries, and angular juxtapositional orientations conducive to conductivity.

More specifically, the invention comprises superconducting glass-ceramic articles consisting essentially of the oxides of Bi, Ca, Sr, Cu and Zn, wherein oxides are present in the stoichiometric formula range: $Bi_2Ca_xSr_zZn_nCu_wO_y$. In the stoichiometric formula, x ranges about 1-2, z ranges about 1-2, n ranges about 0.001-2, w ranges about 1-2, and y ranges about 6-11.

In a further aspect, the invention comprises a method for making a superconducting glass-ceramic article offering significantly improved article forming capabilities. Broadly stated, that method includes the steps of, first, melting an oxide batch to provide a molten glass offering the desired improved glass stability characteristics. Such glasses will preferably consist essentially, in weight percent, of about 50-55% $Bi_2O_3$, 5-12% CaO, 15-20% SrO, 8-20% CuO, and an amount of ZnO at least effective to stabilize the composition as a glass.

For the purpose of enhancing glass stability, the ZnO content can be on the order of 0.01% by weight, or more preferably at least 0.1% ZnO by weight. For highest glass stability, ZnO concentrations of 0.5-12% by weight are particularly preferred.

The molten glass thus provided is next formed into a glass shape of a selected configuration. The shape may be a thin coating, or it may be a glass shape of relatively substantial cross-section. Advantageously, the glass can in most cases be formed into a shape having at least one dimension in excess of 1 mm in thickness, yet will still be essentially free of crystalline precipitates or inclusions.

After the glass shape has been provided, it is crystallized by heat treatment. This treatment will comprise heating the glass shape, preferably at a temperature in the range of about 800°-890° C. for a time sufficient to develop a superconducting Bi-Ca-Sr-Cu oxide crystal phase therein.

Optional additives may be present in the glass-ceramic superconductors of the invention, provided they are maintained at levels below those causing either destabilization of the glass or loss of superconducting characteristics. Thus superconducting glass-ceramic articles such as above described may additionally contain one or more additives selected from the group consisting of alumina, silver, tin, lead, sodium, potassium and fluorine, but these additives will preferably not exceed, in total, about 2% by weight of the glass-ceramic composition.

The above-described compositions can produce a superconducting glass-ceramic wherein the mechanical properties of the material are enhanced, and wherein platelets or other crystallites exceeding 100 microns in at least one dimension and ranging in size up to 1000 microns in one or more dimensions can be developed. Volume proportions of superconducting phases have ranged from as low as 1 to perhaps as high as 60% by volume, as measured magnetically at 65° K. However, crystal phase characteristics such as a large platey or ribbon-like habit, with interweaving of the crystals in certain cases, are considered to significantly improve properties such as room temperature conductivity.

With crystal sizes ranging up to 1000 microns being attainable, these materials promise improved utility for the production of ribbon-like conductive media. Additionally, since the material is at first a glass, it may be drawn out similarly to a fiber, formed into shapes as a glass, coated on a substrate, and subsequently crystallized to form the ceramic portion of the glass-ceramic. The substantially improved glass forming and handling characteristics of the compositions of the invention are critically important where existing glass forming processes are to be utilized for superconducting component manufacture.

BRIEF DESCRIPTION OF THE DRAWINGS

FIG. 5 is a plot of the magnetization vs. applied magnetic field for a superconducting glass-ceramic material.

DETAILED DESCRIPTION OF THE PREFERRED EMBODIMENTS

Figure 1:
FIG. 1 is an SEM micrograph showing angularly juxtaposed platelets a superconducting glass-ceramic material.

The process of producing the superconducting glass-ceramics of the invention can follow conventional glass melting practice. The material is batched from carbonates and/or oxides of bismuth, strontium, calcium, zinc and copper. The batched materials are melted at temperatures from 1000° to 1350° C. and then cast or, if desired, rapidly quenched, producing an amorphous structure. This intermediate material is a glass. The glass is subsequently heated at about 800 to 890° C., preferably between about 800–850° C., in an oxygen rich environment or air, to form platelets or crystallites intimately interspersed with the glass, forming a glass-ceramic superconductor.

An advantage provided by these relatively stable glasses is the gain in control over the grain size of the final crystallized material. This control permits the attainment of very fine crystal grains, which are useful to provide high critical fields for magnetic shielding in these materials. Alternatively, heat treatment variations can provide a large overlapping platelet crystal structure which imparts high room temperature conductivity to the superconducting material.

In a generalized preferred procedure for synthesizing a superconducting glass-ceramic in accordance with the invention, quantities of batch materials such as $Bi_2O_3$, CaO, $SrCO_3$, ZnO and CuO are tumble-mixed together for times on the order of an hour. The batches are then placed in alumina crucibles and heated in a furnace in air to a temperature of approximately 1150° C. for a time sufficient to achieve a homogeneous melt.

The melts thus provided are then withdrawn from the furnace and poured onto a stainless steel table into glass patties approximately $4 \times 8 \times 0.5$ inches in size. If necessary, the melts can be pressed with a stainless steel block to provide rapid quenching and still further reduce any possibility that devitrification of the casting will occur. The resulting solids are typically black and exhibit glassy fracture.

Samples of glasses produced as described are then placed in a tube or other furnace equipped for air and oxygen flow. Heat treatment is carried out while the furnace is supplied with a continuous flow of air or oxygen. Gas flow is generally continued during heat-up, high temperature dwell, and cool-down intervals. The furnace is preferably maintained at peak operating temperatures in the 800–850° C. range, with these temperatures being maintained for times on the order of about 12 hours. Cooling of the samples is typically carried out at the furnace rate, i.e., over an interval which may be as long as 15 hours.

One technique for controlling crystal morphology in crystallized superconductors made as above described relates to the positioning of the samples during heat treatment. For flat plate samples such as produced in accordance with the above casting procedure, fine-grained crystal development is favored by horizontal plate orientation in the furnace, while large platelet growth is favored by a vertical plate orientation. The reason for this difference in crystallization behavior is not fully understood, although it is presently hypothesized that vertical plate orientation creates an environment more akin to crystallization from a melt, and thus larger and more oriented crystals.

The percent of superconductive phases present in the materials described herein is determined from magnetization measurements carried out at low temperatures. Magnetization vs. applied magnetic field measurements are made with a vibrating sample magnetometer, using fields up to 10,000 Gauss. Cooling is provided by a flow cryostat. Data can be taken down to 65K by pumping on the liquid nitrogen coolant. Samples for these tests consist of ground powders of superconducting glass-ceramic positioned in small nylon sample holders. The field is applied perpendicular to the long axis of the sample holders.

Electrical resistivity measurements are made by the four probe method. Four gold strips are evaporated onto solid glass-ceramic samples and electrical contacts are made to these with silver epoxy. A flow cryostat, using liquid helium coolant, is used to lower the temperature of samples to about 10K.

As previously noted, specific advantages of the superconducting glass-ceramic compositions of the invention include significantly improved glass melting and forming behavior. In many of these compositions, glass pieces well in excess of 1 cm in thickness can be formed by direct casting onto stainless steel without additional quenching. The products are completely homogeneous insofar as can be determined under electron microprobe analysis. This behavior is in marked contrast to that of ordinary Bi-Ca-Sr-Cu-O melts, which frequently require quenching and pressing to thicknesses on the order of 1 mm in order to provide glasses reasonably free from uncontrolled devitrification.

The glass-ceramic superconductors of the invention, particularly when heat treated to provide a platelet crystal structure, can exhibit metallic conduction behavior characterized by exceptionally high room temperature conductivity. Typically, electrical resistivities in platelet-containing samples will not exceed about $10^{-4}$ ohm-cm at room temperature. When cooled to cryogenic temperatures, rapid decreases in sample resistivity associated with the superconducting transition are normally observed in the temperature regime of 75–85° K.

The invention is more fully illustrated by the following detailed examples, which are intended to be illustrative rather than limiting.

EXAMPLE 1

To provide a batch for a glass-ceramic superconductor, 544 grams of $Bi_2O_3$, 69 grams of CaO, 50 grams of ZnO, 258 grams of $SrCO_3$, 185 grams of CuO, and 15 grams of $Al_2O_3$ were mixed and melted as a glass. This batch corresponds to a stoichiometric oxide composition of approximately: $Bi_2Ca_{0.87}Sr_{1.46}Cu_{2.07}Al_{0.39}Zn_{0.54}O_{8.78}$. The batch was melted at 1150° C. in a platinum crucible in air, and the melt was then poured into a stainless steel mold.

The cast glass plate thus provided was about 0.5 inch (1.72 cm) thick. The glass was converted to a glass-ceramic material by furnace heat treatment in accordance with the preferred procedure above described. The glass was initially heated to a temperature of about 850° C., maintained at 850° C. for 12 hours, and then cooled at furnace rate to room temperature.

After heat treatment, the sample had a flat, fine grained appearance. The inside was comprised of shiny crystallites, up to 1000 microns in size. Powder x-ray analysis showed a crystalline phase with a structure similar to that of $Bi_2(CaSr)_3Cu_2O_8$, unidentified lines, and glass. SEM indicated that the crystallites were comprised of flat, mica-like grains of up to several hundred microns in length and up to 1 micron thick. Magnetization measurements at 67° K. indicate 4 volume percent of superconducting phases present in the sample.

EXAMPLE 2

A glass batch consisting of about 53.1 parts $Bi_2O_3$, 6.4 parts CaO, 17.7 parts SrO, 18.1 parts CuO, and 4.6 parts ZnO is compounded for melting. This batch yields a melt for a glass having a stoichiometric composition of approximately $Bi_2Ca_1Sr_{1.55}Cu_2Zn_{0.5}O_8$ upon melting as described above in Example 1.

The glass melt having the composition described is formed into a glass patty by casting onto a steel plate. The stability of the glass is sufficient to permit direct casting of the melt to a thickness of about 0.25 inches without significant devitrification. Thus electron microprobe analysis demonstrates that the casting is substantially amorphous and homogeneous.

Pieces of the amorphous glass patty produced as described were next heated at 850° C. for 12 hours in oxygen. This treatment was sufficient to convert the glass pieces to highly crystalline glass-ceramics.

Resistivity measurements were made on a typical glass-ceramic samples produced as described over a temperature range of about 70–290° K. A superconducting transition was observed beginning at about 85° K., although the point of zero resistance was not reached at 70K.

The room temperature resistivity of a typical superconducting glass-ceramic sample produced in accordance with this Example is about $10^{-4}$ ohm-cm. This is an order of magnitude lower than typical prior art Bi-Ca-Sr-Cu-O glass-ceramics, and also lower than that of conventional ceramic superconductors of this composition.

Electron microprobe analyses indicate the presence, in the glass-ceramic samples produced as above described, of a combination of superconducting phases. Thus both $Bi_2Ca_{1.5}Sr_{1.5}Cu_2O_8$ ("4334", Tc=85K) and $Bi_2Ca_1Sr_1Cu_1O_6$ ("2111", Tc=35K) phases appear to be present. Magnetization tests at 67° K. show about 8 volume % of superconducting phases present in the samples.

Glass samples of the above described composition which are heated to 850° C. for 12 hours in air yield a crystalline material that again comprises a mixture of "4334" and "2111" phases. These are magnetically similar to the earlier described glass-ceramics, but have room temperature resistivities on the order of $10^{-3}$ ohm-cm.

Table I below summarizes additional data on superconducting glass-ceramics provided in accordance with the invention. Included in Table I for each of the compositions evaluated are an oxide composition, in weight percent oxide as batched for each of the glass melts, and information relating to the heat treatments used to develop superconducting phases in the glass-ceramic products.

Heat treatment data includes a report of heat treatment atmosphere (HT Atm.), indicated whether the treatment was carried out in air, in oxygen (Oxy), or in a mixture of air and oxygen (O/A). Also reported are the peak heat treatment temperatures (HT Temp) in °C. and times at peak temperature (HT Time) in hours. The orientation of each sample during heat treatment (HT Orien.), whether aligned parallel with (horizontal) or perpendicular to (vert.) the bottom of the heat treating furnace, is also given.

Finally, the volume percent of superconducting phases present int he samples (SC Phase) are recorded, as determined by magnetization measurements at 67° K. As would be expected, variations in the volume percent of superconducting phases present can result from heat treatment variables as well as variations in sample composition.

TABLE I

| Superconducting Glass-Ceramics | | | | | | |
|---|---|---|---|---|---|---|
| Oxides | Example No. | | | | | |
| (wt %) | 3 | 4 | 5 | 6 | 7 | 8 |
| $Bi_2O_3$ | 53.1 | 53.1 | 53.1 | 52.1 | 52.1 | 53.6 |
| CaO | 6.4 | 6.4 | 6.4 | 6.6 | 6.6 | 9.7 |
| SrO | 17.7 | 17.7 | 17.7 | 17.3 | 17.3 | 17.9 |
| CuO | 18.1 | 18.1 | 18.1 | 17.7 | 17.7 | 18.3 |
| ZnO | 4.6 | 4.6 | 4.6 | 4.8 | 4.8 | 0.5 |
| $Al_2O_3$ | — | — | — | 1.4 | 1.4 | — |
| HT Temp. (°C.) | 850 | 850 | 850 | 850 | 850 | 830 |
| HT Atm. | Air | Air | Oxy | Air | Oxy | Oxy |
| HT Time (hours) | 12 | 12 | 12 | 12 | 12 | 12 |
| HT Orien. | Hor. | Hor. | Vert. | Vert. | Vert. | Hor. |
| SC phase (% vol.) | 8 | 1.5 | 6.5 | 1 | 1 | 5 |
| Oxide | 9 | 10 | 11 | 12 | 13 | 14 |
| $Bi_2O_3$ | 53.6 | 53.6 | 53.9 | 53.9 | 53.8 | 53.8 |
| CaO | 9.7 | 9.7 | 9.7 | 9.7 | 9.7 | 9.7 |
| SrO | 17.9 | 17.9 | 17.9 | 17.9 | 18.0 | 17.9 |
| CuO | 18.3 | 18.3 | 18.0 | 13.8 | 13.8 | 9.2 |
| ZnO | 0.5 | 0.5 | 0.47 | 4.7 | 4.7 | 9.4 |
| $Al_2O_3$ | — | — | ~2 | ~2 | — | — |
| HT Temp. (°C.) | 830 | 890 | 860 | 860 | 845 | 845 |

TABLE I-continued

Superconducting Glass-Ceramics

| HT Atm. | Oxy | Oxy | Oxy | Oxy | Oxy | Oxy |
|---|---|---|---|---|---|---|
| HT Time (hours) | 12 | 12 | 8 | 8 | 12 | 12 |
| HT Orien. | Vert. | Vert. | Hor. | Hor. | Hor. | Hor. |
| SC phase (% vol.) | 8 | 9 | <1 | <1 | 5 | 3 |

Based on testing such as hereinabove described, a region of good glass formability in the Bi-Ca-Sr-Cu-Zn oxide system has been identified which offers an excellent combination of forming and superconducting properties. That region is presently considered to comprise glass and glass-ceramic compositions consisting essentially, in weight percent on an oxide basis, of about 50–55% $Bi_2O_3$, 5–12% CaO, 15–20% SrO, 8–20% CuO, and 0.5–12% ZnO. Optional additions of oxide, halide, and metallic constituents selected from the group consisting of $Al_2O_3$, PbO, $Na_2O$, $Li_2O$, $SnO_2$, $K_2O$, fluoride and silver, in amounts totalling not more than about 2% by weight, may be included if desired.

Chemical analyses of samples provided in accordance with the invention in some cases show the presence of several impurities, such as carbon, silicon, iron, and magnesium. However, it is believed that these impurities have little effect on the superconductivity of the examples at the low levels observed.

Referring again to the drawings, FIG. 1 shows angularly juxtaposed platelets in superconducting glass-ceramics wherein large crystals can be grown. The scale is 100 microns. Within this view, crystallites of up to 1000 microns are apparent. In expanded views crystallites of 1000 microns were noted. Generally, larger crystals indicate a higher aspect ratio.

Figure 2:
FIG. 2 is an SEM micrograph showing parallel juxtaposed platelets in a superconducting glass-ceramic material.
Figure 3:
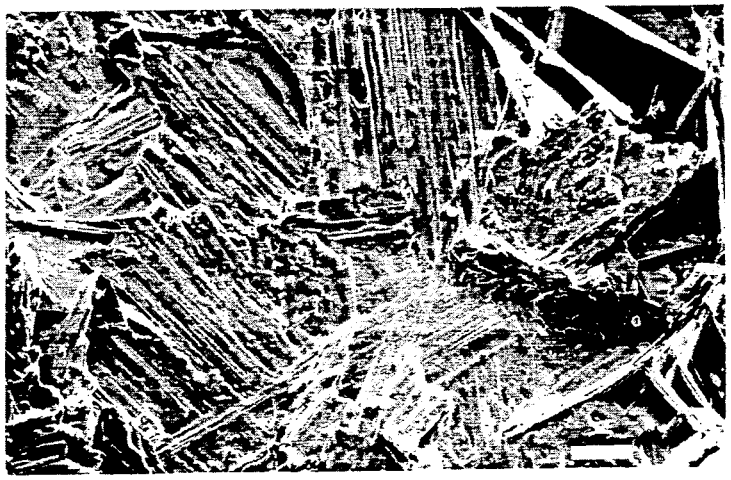
FIG. 3 is an SEM micrograph showing the dimensions and extent of the interwoven characteristic of the platelets in a superconducting glass-ceramic material.

The grain sizes noted have been found to depend upon the heating temperature as well as composition. The lower the temperature the smaller the grain size. FIG. 2 shows that the same platelets can be disposed parallel to one another with a consistent form. The scale is 100 microns. FIG. 3 shows an overall view of the composite superconducting material wherein the scale is again 100 microns. Parallel or interwoven platelets may be important in the production of viable superconducting structures since the disposition of the platelets will provide a means for communicating, one from the other. It is noted that the platelets are interwoven. Interwoven platelets add vertical and lateral mechanical strength. The orientation of the platelets and/or crystallites may be effected by the orientation of the sample when heat treated. The aggregate crystal structure of 1 millimeter has been noted. By aggregate crystal structure is meant, a unified oriented crystallite or platelet aggregation.

Figure 4:
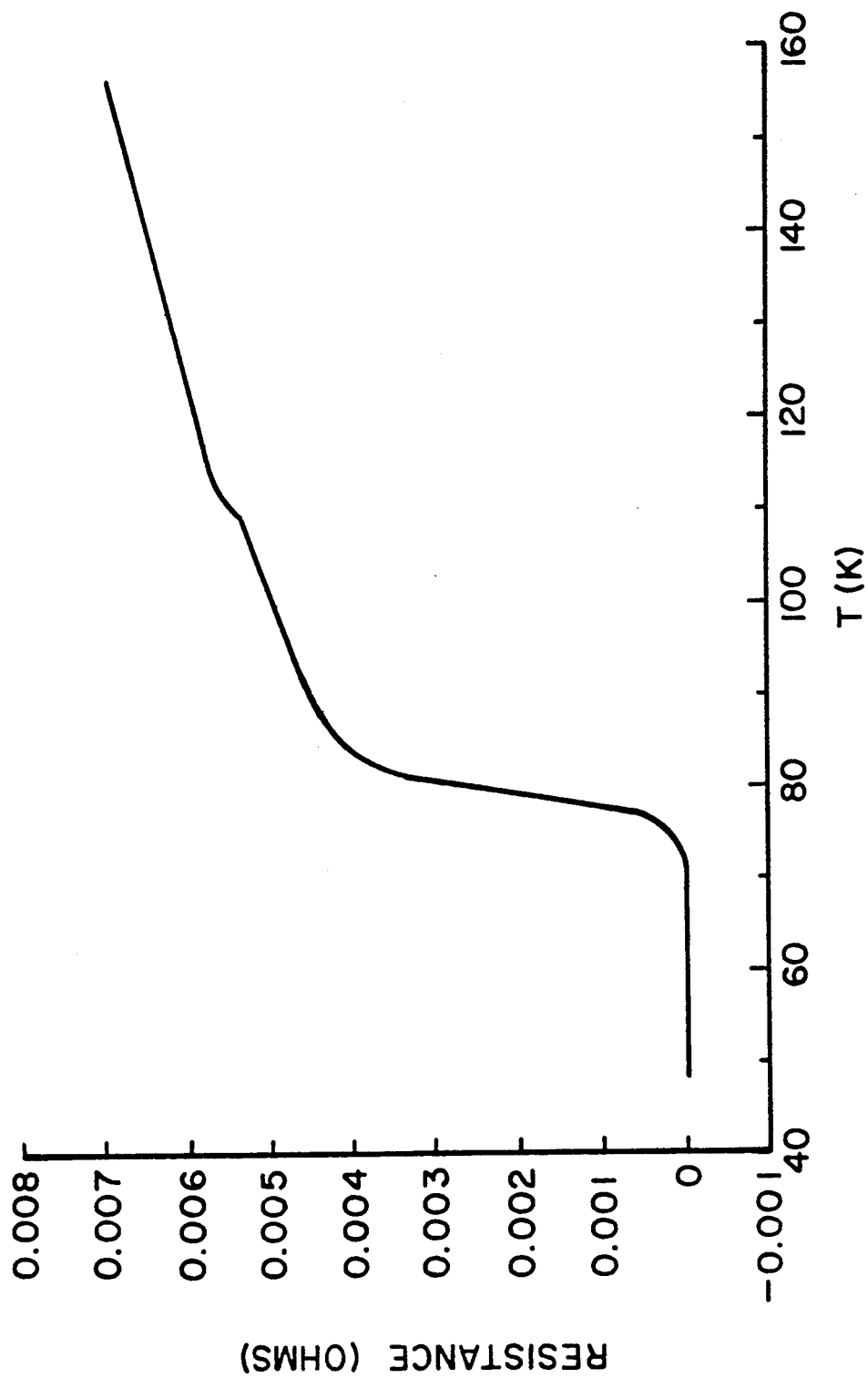
FIG. 4 is a plot of resistance vs. temperature for a superconducting glass-ceramic material.

FIG. 4 shows a plot of resistance in ohms versus Temperature in Kelvins for a typical superconducting Bi-Sr-Ca-Cu-O glass-ceramic. The onset of bulk superconductivity in the sample is manifested by the rapid decrease in resistivity commencing at about 85° K.

FIG. 5 is a plot of a magnetization measurement. The dotted line shows where the measured magnetization deviates from linearity indicating the first critical field of greater than 2000 Gauss.

In summary, then, ZnO has been found to be a surprisingly effective additive, in the Bi-Ca-Sr-Cu-O oxide composition system, for the purpose of improving the stability or resistance of the oxide melt to crystallization on cooling. Additions of only 0.1% ZnO by weight to the composition are found to suppress crystallization of cast molten material, and additions of as little as 0.01% by weight are considered to be useful and effective for the purpose of improving melt behavior and control of crystal development. Hence, while ZnO concentrations of 0.5–20% by weight yield the highest improvements in glass stability, additions of 0.01%, or preferably at least 0.1%, will be found to yield significant improvements in glass quality as determined by visual observation, X-ray diffraction and/or electron microscopic examination of glass articles produced directly from the molten oxides.

We claim:

1. A superconducting glass-ceramic consisting essentially of the oxides of Bi, Ca, Sr, Cu and Zn in the stoichiometric formula range: $Bi_2Ca_xSr_zZn_nCu_wO_y$, wherein x ranges about 1–2, z ranges about 1–2, n ranges about 0.001–2, w ranges about 1–2, and y ranges about 6–11.

2. A superconducting glass-ceramic article in accordance with claim 1 which additionally contains one or more additives selected from the group consisting of silver, alumina, tin, lead, sodium, potassium and fluorine in a proportion totalling not more than about 2% by weight of the glass-ceramic article.

3. A superconducting glass-ceramic article in accordance with claim 1 wherein the crystalline phase comprises interwoven or platey crystallites having at least one dimension exceeding 100 microns in size.

4. A superconducting glass-ceramic article in accordance with claim 1 which has an oxide composition consisting essentially, in weight percent, of about 50–55% $Bi_2O_3$, 5–12% CaO, 15–20% SrO, 8–20% CuO, and 0.01–12% ZnO.

5. A superconducting glass-ceramic article in accordance with claim 4 which additionally comprises up to a total of 2% by weight of additives selected from the group consisting of $Al_2O_3$, PbO, $Na_2O$, $Li_2O$, $SnO_2$, $K_2O$, fluorine and silver.

* * * * *